United States Patent
Su

(10) Patent No.: US 12,374,659 B2
(45) Date of Patent: Jul. 29, 2025

(54) POWER MODULE

(71) Applicant: SUPER GROUP SEMICONDUCTOR CO., LTD., Hsinchu County (TW)

(72) Inventor: Jen-Jun Su, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 559 days.

(21) Appl. No.: 17/707,300

(22) Filed: Mar. 29, 2022

(65) Prior Publication Data

US 2023/0238361 A1    Jul. 27, 2023

(30) Foreign Application Priority Data

Jan. 27, 2022 (TW) ................................. 111103494

(51) Int. Cl.
*H01L 25/07* (2006.01)
*H01L 23/373* (2006.01)
*H01L 25/18* (2023.01)

(52) U.S. Cl.
CPC ........ *H01L 25/071* (2013.01); *H01L 23/3735* (2013.01); *H01L 25/18* (2013.01)

(58) Field of Classification Search
None
See application file for complete search history.

(56) References Cited

U.S. PATENT DOCUMENTS

| | | | |
|---|---|---|---|
| 10,609,846 | B1 | 3/2020 | Lin |
| 2017/0353119 | A1 | 12/2017 | Uchida et al. |
| 2021/0057324 | A1* | 2/2021 | Leng ............... H01L 23/4334 |
| 2021/0185794 | A1* | 6/2021 | Snyder ............. H05K 1/0204 |

FOREIGN PATENT DOCUMENTS

| | | |
|---|---|---|
| CN | 113271021 A | 8/2021 |
| EP | 3252813 A2 | 12/2017 |
| TW | M577968 U | 5/2019 |
| TW | 202110289 A | 3/2021 |

\* cited by examiner

*Primary Examiner* — Sue A Purvis
*Assistant Examiner* — Jordan M Klein
(74) *Attorney, Agent, or Firm* — Li & Cai Intellectual Property (USA) Office

(57) ABSTRACT

A power module is provided. The power module includes an electrical interconnection assembly and at least one electronic element group. The electrical interconnection assembly includes a conductive structure and a circuit board. The conductive structure includes a first conductive member and a second conductive manner insulated from each other and arranged side by side. The circuit board is disposed on the conductive structure. The circuit board has an opening. The at least one electronic element group includes a power element that includes a first pad, a second pad, and a third pad. The first and second pads pass through the opening, and are respectively and electrically connected to the first and second conductive members. The third pad is disposed on the circuit board.

19 Claims, 15 Drawing Sheets

POWER MODULE

CROSS-REFERENCE TO RELATED PATENT APPLICATION

This application claims the benefit of priority to Taiwan Patent Application No. 111103494, filed on Jan. 27, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power module, and more particularly to a power module having a high withstand voltage.

BACKGROUND OF THE DISCLOSURE

In the related art, a power module can be implemented in a household frequency conversion system, an electric vehicle, and an industrial control system to convert electrical power or control a circuit. In a conventional circuit system, a power element, a gate driving element, and a control element are usually integrated. In a conventional technology, after a specific circuit layout is formed in a main printed circuit board according to a circuit design, a plurality of discrete elements (such as the power element, the gate driving element and the control element that are related to one another) are mounted on the main printed circuit board, so as to form the power module.

However, in certain circuits (e.g., a voltage converter circuit), the power module must be operated under a high voltage or a high current condition. Accordingly, the power module is required to withstand a high voltage and a high current.

SUMMARY OF THE DISCLOSURE

In response to the above-referenced technical inadequacy, the present disclosure provides a power module, which can withstand a high voltage and is operable under a high current condition.

In one aspect, the present disclosure provides a power module including an electrical interconnection assembly and a first electronic element group. The electrical interconnection assembly includes a conductive structure and a first circuit board. The conductive structure includes a first conductive member, a second conductive member, and a third conductive member. The first conductive member, the second conductive member, and the third conductive member are arranged side by side and insulated from one another. The first circuit board partially covers the conductive structure. The first electronic element group includes a first power element and a second power element. The first power element joins the first conductive member and the second conductive member. The first power element is electrically connected to the first circuit board. The second power element joins the first conductive member and the third conductive member. The second power element is electrically connected to the first circuit board, and the second power element is electrically connected to the first power element in a series manner through the first conductive member.

In another aspect, the present disclosure provides a power module. The power module includes an electrical interconnection assembly and an electronic element group. The electrical interconnection assembly includes a conductive structure and a circuit board. The conductive structure includes a first conductive member and a second conductive manner insulated from each other and arranged side by side. The circuit board is disposed on the conductive structure. The circuit board has an opening, and the opening partially corresponds in position to each of the first conductive member and the second conductive member. The electronic element group includes a power element that includes a first pad, a second pad, and a third pad. The first pad and the second pad pass through the opening, and are respectively and electrically connected to the first conductive member and the second conductive member. The third pad is disposed on the circuit board.

Therefore, in the power module provided by the present disclosure, by virtue of "the conductive structure includes the first conductive member and the second conductive member that are arranged side by side and insulated from each other," "the circuit board partially covers the conductive structure," and "the first pad and the second pad of the power element are respectively and electrically connected to the first and second conductive members, and the third pad is disposed on the circuit board," the power module can operate under a high voltage or a high current condition.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
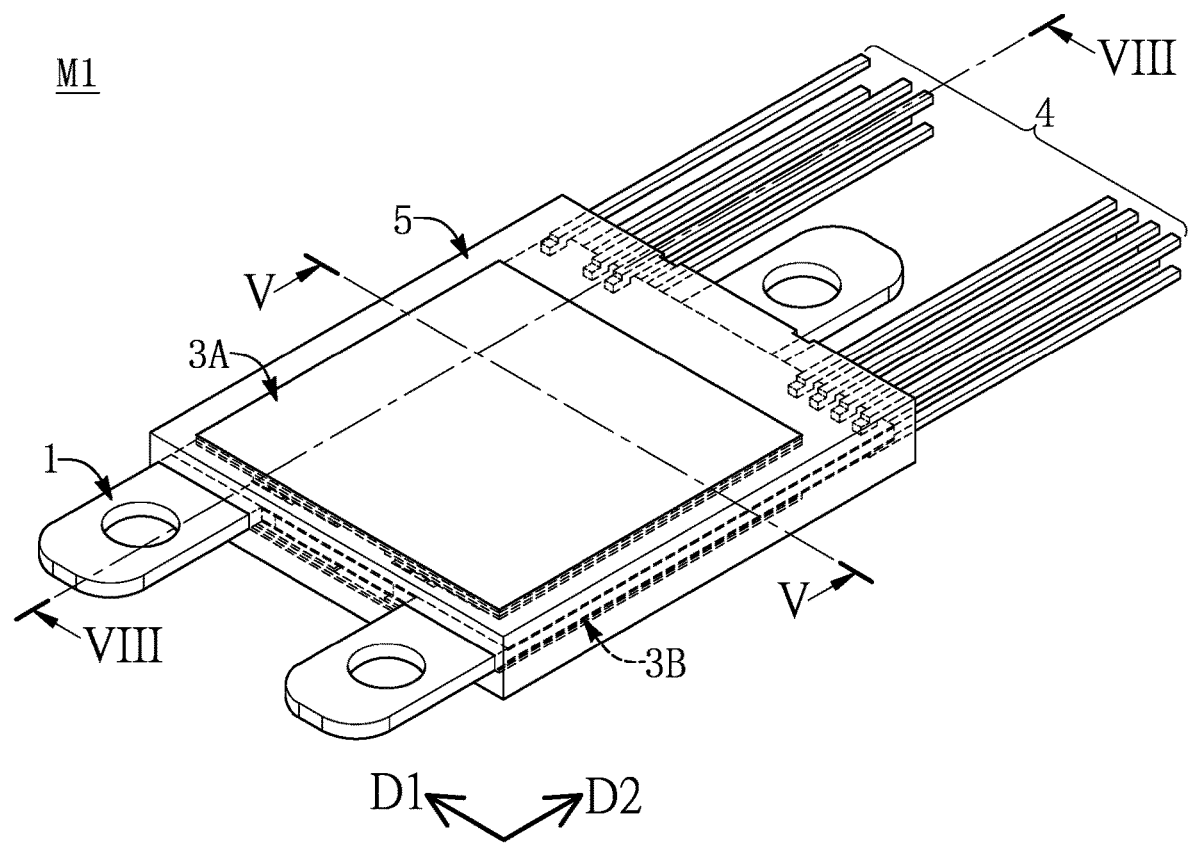
FIG. 1 is a schematic perspective view of a power module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
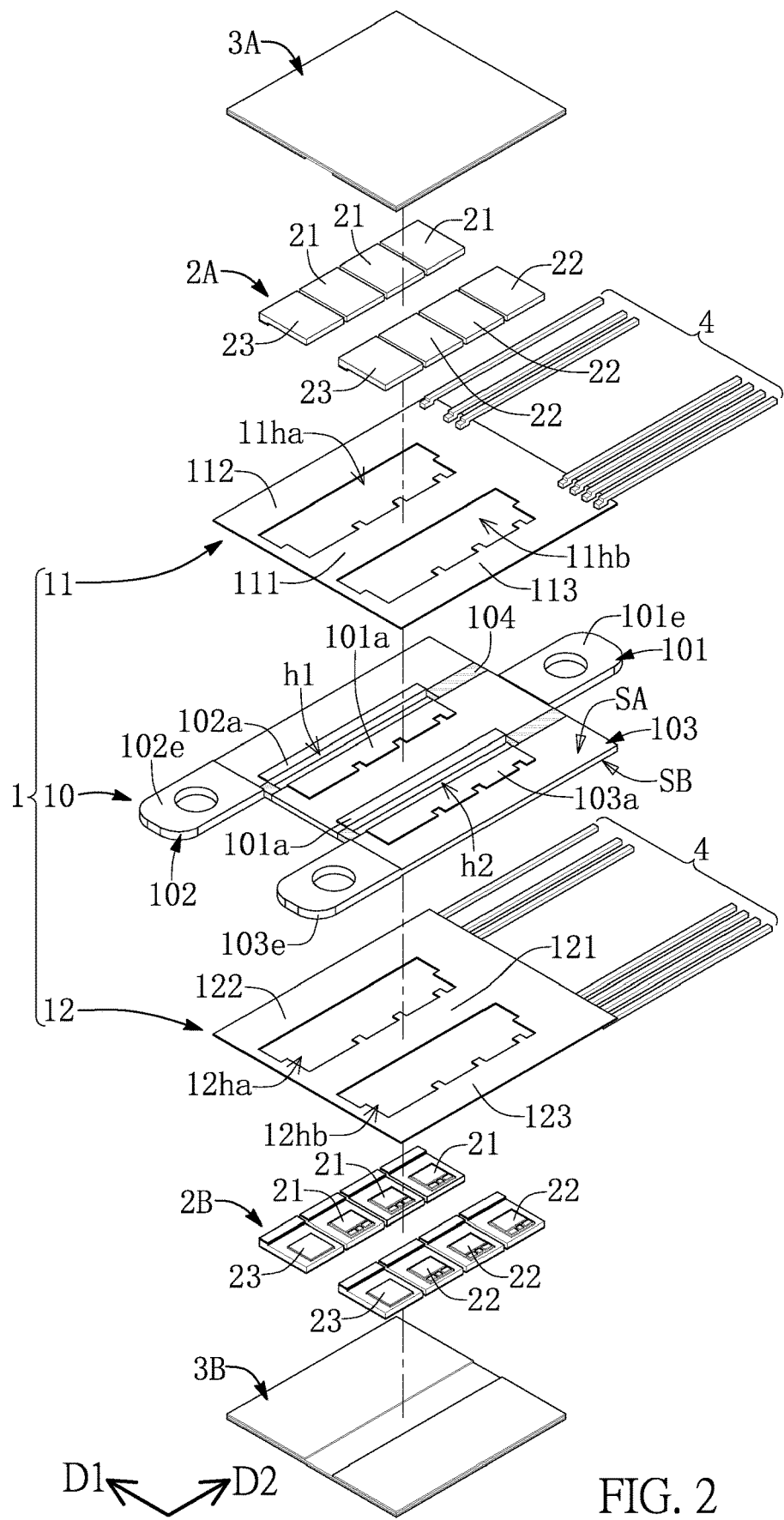
FIG. 2 is a schematic exploded view of the power module without illustrating a packaging layer according to the first embodiment of the present disclosure.
Figure 3:
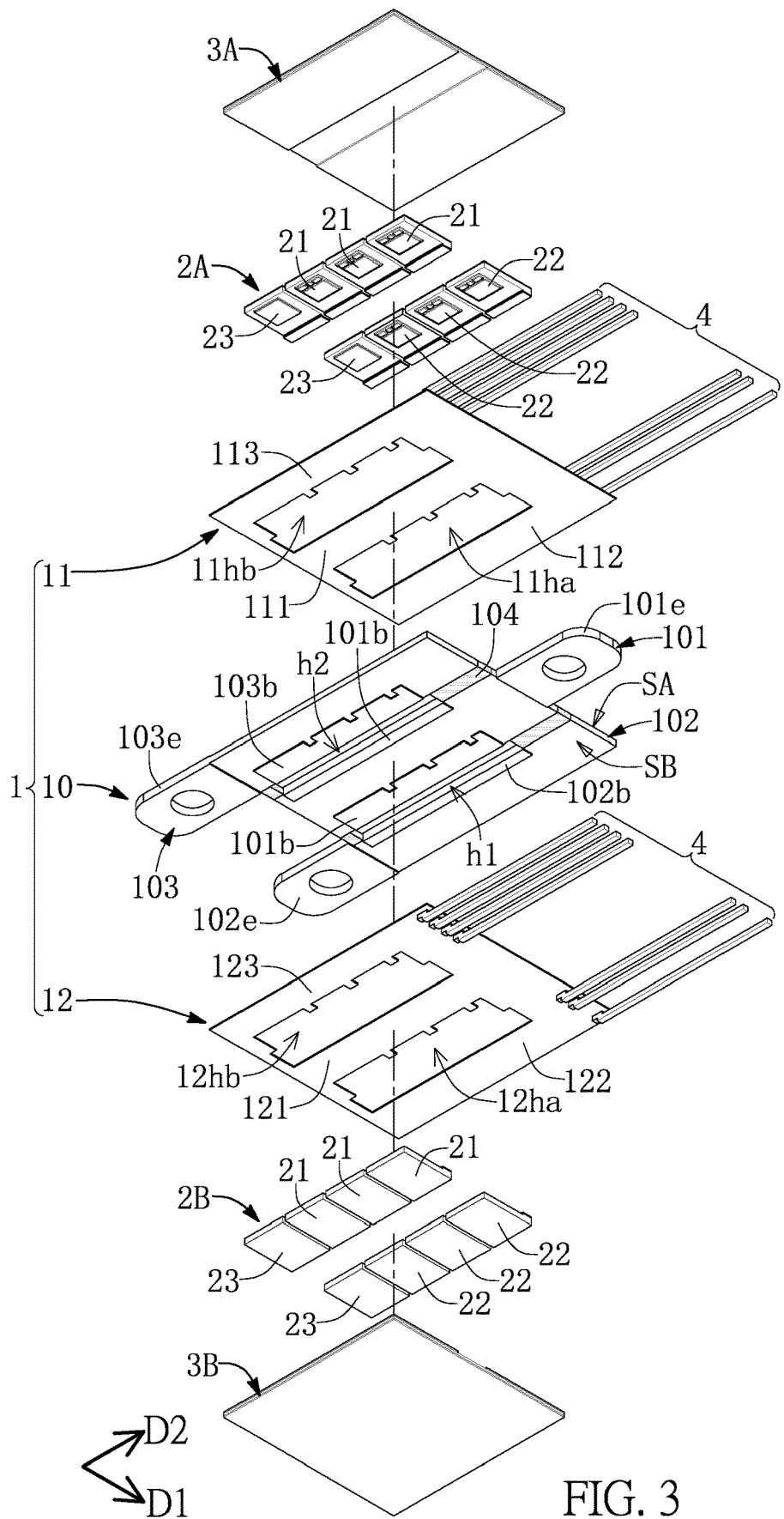
FIG. 3 is a schematic exploded view of the power module without illustrating the packaging layer from another angle according to the first embodiment of the present disclosure.

Reference is made to FIG. 1 to FIG. 3. FIG. 1 is a schematic perspective view of a power module according to a first embodiment of the present disclosure. FIG. 2 and FIG. 3 are schematic exploded views of the power module without illustrating a packaging layer when viewed from different angles according to the first embodiment of the present disclosure, respectively. A power module M1 of the instant embodiment can be implemented in a circuit design of an electronic product, and is operable under a high voltage or a high current condition. In the instant embodiment, the power module M1 includes an electrical interconnection assembly 1, at least one electronic element group 2A, 2B (two of which are exemplified in FIG. 2), a heat dissipation element 3A, 3B, a plurality of input/output pins 4, and a packaging layer 5.

The electrical interconnection assembly 1 is used to not only support the electronic element groups 2A, 2B, but also establish electrical connections among a plurality of electronic elements of the electronic element groups 2A, 2B. The detailed structure of the electrical interconnection assembly 1 and the electrical connections between the electrical interconnection assembly 1 and the electronic element groups 2A, 2B will be further illustrated in the following description. In the instant embodiment, a circuit that is used to form a part of a voltage conversion system circuit is exemplified for description.

Reference is made to FIG. 2. The electrical interconnection assembly 1 includes a conductive structure 10, a first circuit board 11, and a second circuit board 12. The conductive structure 10 of the instant embodiment includes a first conductive member 101, a second conductive member 102, and a third conductive member 103. The first conductive member 101, the second conductive member 102, and the third conductive member 103 are arranged side by side in a first direction D1, and are insulated from one another. The second conductive member 102 and the third conductive member 103 are respectively located at two opposite sides of the first conductive member 101.

Specifically, the first to third conductive members 101 to 103 can be used to establish a current transmission path between any two of the electronic elements in the electronic element groups 2A, 2B. In the instant embodiment, each of the first to third conductive members 101 to 103 is in a plate shape, and has a thickness ranging from 0.5 mm to 4 mm. Furthermore, each of the first to third conductive members 101 to 103 can be made of a material having a high conductivity (such as copper or any one of copper base alloys), so as to reduce a parasitic resistance. As such, a larger current is allowed to flow through the first to third conductive members 101 to 103, so that the power module M1 can operate under a high voltage or a high current condition.

In the instant embodiment, the first conductive member 101 and the second conductive member 102 are spaced apart from each other to define a trench h1 therebetween. In addition, the first conductive member 101 and the third conductive member 103 are also spaced apart from each other to define another trench h2 therebetween. In the instant embodiment, the electrical interconnection assembly 1 further includes insulating materials 104. One of the insulating materials 104 is disposed in the trench h1 between the first and second conductive members 101, 102, so as to connect the first conductive member 101 to the second conductive member 102. Furthermore, another insulating material 104 is disposed in the trench h2 between the first and third conductive members 101, 103, so as to connect the first conductive member 101 to the third conductive member 103.

As shown in FIG. 1 and FIG. 2, the first conductive member 101 has a first ending portion 101e, the second conductive member 102 has a second ending portion 102e, and the third conductive member 103 has a third ending portion 103e. The second ending portion 102e and the third ending portion 103e are arranged to face the same orientation, and the first ending portion 101e and the second ending portion 102e (or the third ending portion 103e) are arranged to respectively face two opposite orientations. Furthermore, the power module M1 can be electrically connected to another system circuit through the first to third ending portions 101e to 103e. For example, the first ending portion 101e can be electrically connected to a voltage switch terminal. While one of the second ending portion 102e and the third ending portion 103e can be electrically connected to a power voltage terminal, another one of the second ending portion 102e and the third ending portion 103e can be electrically connected to a ground terminal. Moreover, all of the first to third conductive members 101 to 103 have a higher stiffness and a greater strength, so that the power module M1 of the present disclosure can be plugged and connected to another system circuit.

In the embodiment shown in FIG. 2, upward surfaces of the first to third conductive members 101 to 103 jointly define an element arrangement surface SA, and downward surfaces of the first to third conductive members 101 to 103 jointly define another element arrangement surface SB.

Reference is made to FIG. 1 and FIG. 2. In the instant embodiment, the first circuit board 11 and the second circuit board 12 are respectively located at two opposite sides of the conductive structure 10. In other words, the first circuit board 11 is spaced apart from the second circuit board 12 by the conductive structure 10. It should be noted that by arranging the first and second circuit boards 11, 12 at the two opposite sides of the conductive structure 10, warpage of the electrical interconnection assembly 1 caused by a high temperature during a fabrication process (e.g., a reflow process) can be prevented.

At least one of the first and second circuit boards 11, 12 can be a single-layer circuit board or a multilayer circuit board, and another one of the first and second circuit boards 11, 12 can be an insulating board without any circuit layout, a single-layer circuit board or a multilayer circuit board. That is to say, according to practical requirements, one of the first and second circuit boards 11, 12 includes a plurality of wires (not illustrated) and a plurality of pads (not illustrated) that have been arranged on a surface or in an interior thereof. Accordingly, the electronic elements of the electronic element groups 2A, 2B can be disposed on the first circuit board 11 or the second circuit board 12 according to a practical circuit design.

It is worth mentioning that in the instant embodiment, a thickness of the first circuit board 11 and a thickness of the second circuit board 12 are both less than a thickness of the conductive structure 10. Specifically, the thickness of the first circuit board 11 (or the second circuit board 12) ranges from 150 μm to 400 μm. Furthermore, a sum of the thicknesses of the first and second circuit boards 11, 12 is also less than the thickness of the conductive structure 10.

Figure 4:
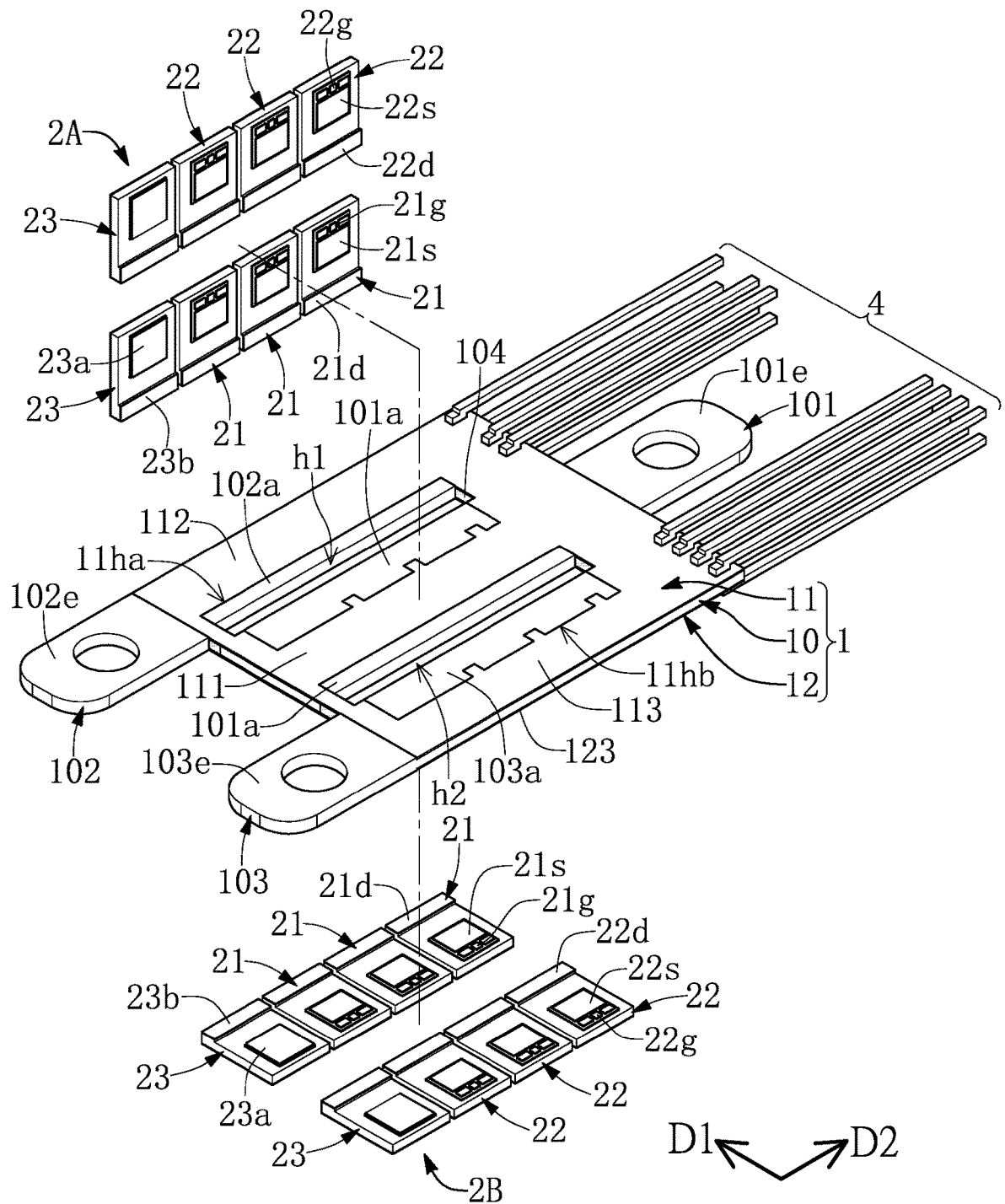
FIG. 4 is a partial schematic exploded view of the power module without illustrating the packaging layer and a heat dissipation element according to the first embodiment of the present disclosure.

Reference is made to FIG. 2 and FIG. 4, in which FIG. 4 is a partial schematic exploded view of the power module without illustrating the packaging layer and a heat dissipation element according to the first embodiment of the present disclosure. Specifically, the first circuit board 11 of the instant embodiment has two openings 11ha, 11hb. One of the openings 11ha, 11hb is arranged to correspond in position to the trench h1 between the first and second conductive members 101, 102, and each of the first and second conductive members 101, 102 is partially exposed from the opening 11ha. Accordingly, in the first direction D1, a width of the opening 11ha is greater than a width of the trench h1. The opening 11ha defines a first pad arrangement region 101a on the first conductive member 101, and defines a second pad arrangement region 102a on the second conductive member 102.

Similarly, another opening 11hb is arranged to correspond in position to the trench h2 between the first and third conductive members 101, 103, and each of the first and third conductive members 101, 103 is partially exposed from the opening 11hb. Accordingly, the opening 11hb defines another first pad arrangement region 101a on the first conductive member 101, and defines a third pad arrangement region 103a on the third conductive member 103. That is to say, the first circuit board 11 partially covers each of the first to third conductive members 101 to 103.

Reference is made to FIG. 3. Similar to the first circuit board 11, the second circuit board 12 also has two openings 12ha, 12hb. The opening 12ha is arranged to correspond in position to the trench h1 between the first and second conductive members 101, 102, and each of the first and second conductive members 101, 102 is partially exposed from the opening 12ha. The opening 12hb is arranged to correspond in position to the trench h2 between the first and third conductive members 101, 103, and each of the first and third conductive members 101, 103 is partially exposed from the opening 12hb. By partially exposing each of the first to third conductive members 101 to 103, a transmission for a high current load and a control signal transmitted through the first or second circuit board 11, 12 can be separately processed.

Accordingly, the second circuit board 12 defines two first pad arrangement regions 101b at a bottom side of the first conductive member 101, and defines a second pad arrangement region 102b and a third pad arrangement region 103b respectively at a bottom side of the second conductive member 102 and a bottom side of the third conductive member 103. However, the present disclosure is not limited thereto. In another embodiment, the second circuit board 12 can have only one of the openings 12ha, 12hb. That is to say, the first circuit board 11 partially covers the element arrangement surface SA, and the second circuit board 12 partially covers the element arrangement surface SB.

It is worth mentioning that in the instant embodiment, the first circuit board 11 and the second circuit board 12 are engaged at the two opposite sides of the conductive structure 10. Referring to FIG. 2 and FIG. 4, the first conductive member 101 has a first recessed region (not denoted by any reference numeral) that is recessed inwardly relative to the two first pad arrangement regions 101a, and the first recessed region is located at a side of the first conductive member 101 facing toward the first circuit board 11. In other words, each of the first pad arrangement regions 101a of the first conductive member 101 is a protrusion platform. Furthermore, the first circuit board 11 includes a first wiring arrangement portion 111 disposed on the first conductive member 101. The first wiring arrangement portion 111 has edge profiles that match edge profiles of the first pad arrangement regions 101a (or the first recessed region) in shape, so that the first wiring arrangement portion 111 is arranged in the first recessed region.

Similarly, as shown in FIG. 3, the second conductive member 102 has a second recessed region (not denoted by any reference numeral) that is recessed inwardly relative to the second pad arrangement region 102a. The third conductive member 103 also has a third recessed region (not denoted by any reference numeral) that is recessed inwardly relative to the third pad arrangement region 103a. The second and third recessed regions are both located at a side facing toward the first circuit board 11. In addition, the first circuit board 11 further includes a second wiring arrangement portion 112 arranged in the second recessed region and a third wiring arrangement portion 113 arranged in the third recessed region. In the instant embodiment, the second wiring arrangement portion 112 has an edge profile that matches an edge profile of the second pad arrangement region 102a in shape, and the third wiring arrangement portion 113 has an edge profile that matches an edge profile of the third pad arrangement region 103a in shape.

That is to say, two side edge profiles of the opening 11ha of the first circuit board 11 complement the edge profile of one of the first pad arrangement regions 101a and the edge profile of the second pad arrangement region 102a, respectively. Furthermore, two side edge profiles of the opening 11hb complement the edge profile of another one of the first pad arrangement regions 101a and the edge profile of the third pad arrangement region 103a, respectively.

Reference is made to FIG. 3. The first to third conductive members 101 to 103 can also respectively have a first recessed region, a second recessed region, and a third recessed region, which are located at a side facing toward the second circuit board 12. Two side edge profiles of the opening 12ha of the second circuit board 12 complement an edge profile of one of the first pad arrangement regions 101b and an edge profile of the second pad arrangement region 102b, respectively. Furthermore, two side edge profiles of the opening 12hb complement an edge profile of another one of the first pad arrangement regions 101b and an edge profile of the third pad arrangement region 103b, respectively. However, the present disclosure is not limited thereto. In another embodiment, a surface of each of the first to third conductive members 101 to 103 that faces toward the second circuit board 12 can be a flat surface.

Reference is made to FIG. 2 to FIG. 4. The electronic element groups 2A, 2B are disposed on the electrical interconnection assembly 1, and are located at two opposite sides of the electrical interconnection assembly 1, respectively. However, the present disclosure is not limited thereto. Each of the electronic element groups 2A, 2B can include one or more than one electronic element (a plurality of electronic elements are exemplarily illustrated in FIG. 1 and FIG. 2). The electronic elements can include one or more than one kinds of elements, such as a power element, a control element, a diode element, a passive element, and a protective element.

The power element can be, for example, an insulated gate bipolar transistor (IGBT), a metal-oxide-semiconductor field effect transistor (MOSFET), or a combination thereof. The material of the power element can be, for example, silicon carbide (SiC), silicon, or gallium nitride (GaN). Furthermore, the diode element can be, for example, a fast recovery diode (FRD) or a power diode. When the power module M1 is applied in a voltage converter circuit, each of the electronic element groups 2A, 2B can include a plurality of power elements 21, 22 that are arranged in an array.

Figure 5:
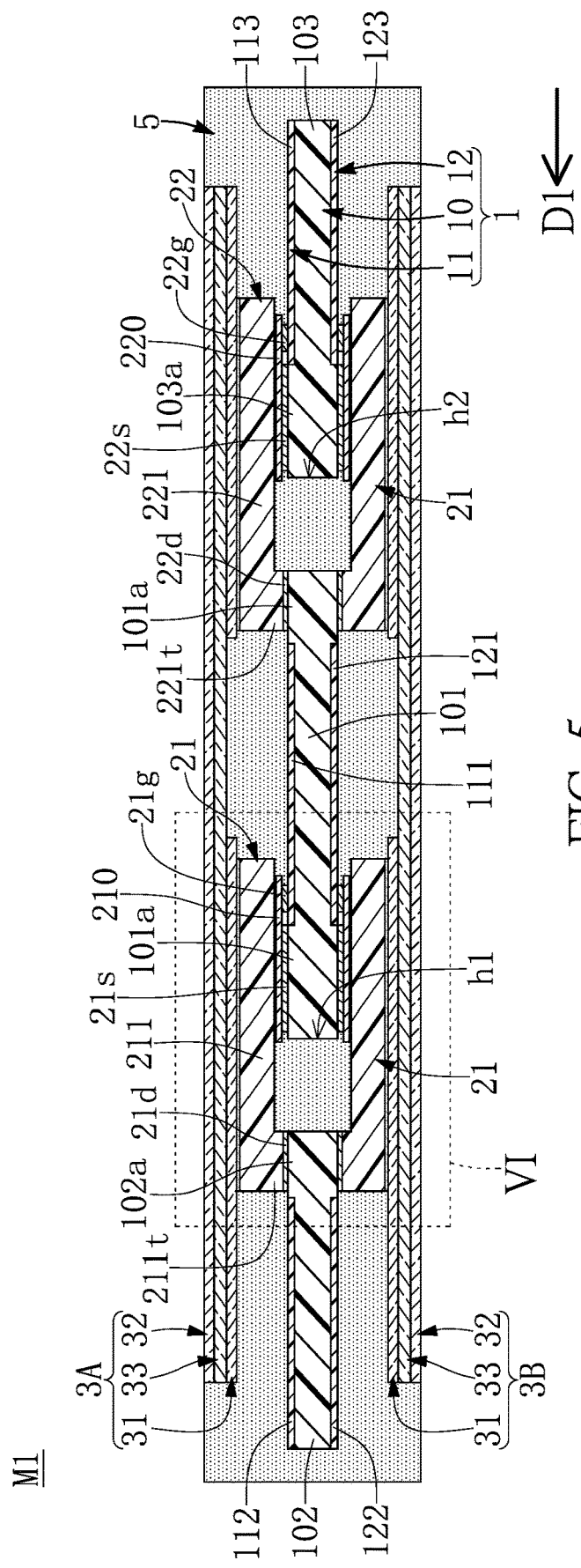
FIG. 5 is a schematic cross-sectional view taken along line V-V of FIG. 1.

Referring to FIG. 4 and FIG. 5, each of the power elements 21, 22 can include a first pad 21s, 22s, a second pad 21d, 22d, and a third pad 21g, 22g. The first pad 21s, 22s can be a source pad, the second pad 21d, 22d can be a drain pad, and the third pad 21g, 22g can be a gate pad. Specifically, each of the power elements 21, 22 can include a power chip 210, 220 and a conductive connecting member 211, 221 that is connected to the power chip 210, 220. The first pad 21s, 22s and the third pad 21g, 22g are located at an active surface of the power chip 210, 220. The conductive connecting member 211, 221 is disposed on a back surface of the power chip 210, 220, and includes a pin portion 211t, 221t. The aforementioned second pad 21d, 22d is disposed at an end of the pin portion 211t, 221t.

For ease of illustration, the electronic element group 2A is defined as a first electronic element group, and the electronic element group 2B is defined as a second electronic element group. Furthermore, in the first electronic element group 2A, the power element 21 that joins the first and second conductive members 101, 102 is defined as a first power element, and the power element 22 that joins the first and third conductive members 101, 103 is defined as a second power element. The first power elements 21 that are arranged in the same row along a second direction D2 can be electrically connected to each other in a parallel manner through the conductive structure 10. Similarly, the second power elements 22 that are arranged in another row along the second direction D2 can be electrically connected to each other in a parallel manner through the conductive structure 10.

Referring to FIG. 4 and FIG. 5, FIG. 5 is a schematic cross-sectional view taken along line V-V of FIG. 1. Specifically, the first pad 21s (the source pad) and the second pad 21d (the drain pad) of each of the first power elements 21 pass through the opening 11ha or 12ha of the first circuit board 11 or the second circuit board 12, and are electrically connected to the first conductive member 101 and the second conductive member 102, respectively. Furthermore, the third pad 21g (the gate pad) of each of the first power elements 21 is disposed on the first wiring arrangement portion 111 or 121 of the first circuit board 11 or the second circuit board 12, and is electrically connected to the circuit (not shown) configured in the first circuit board 11 or in the second circuit board 12.

Specifically, the first pad 22s (the source pad) and the second pad 22d (drain pad) of each of the second power elements 22 pass through the opening 11hb or 12hb of the first circuit board 11 or the second circuit board 12, and are respectively and electrically connected to the first conductive member 101 and the third conductive member 103. Furthermore, the third pad 22g (the gate pad) of each of the second power elements 22 is disposed on the third wiring arrangement portion 113 or 123 of the first circuit board 11 or the second circuit board 12, and is electrically connected to the circuit (not shown) configured in the first circuit board 11 or the second circuit board 12.

Accordingly, as shown in FIG. 5, for the first power element 21 and the second power element 22 that are arranged in the same column along the first direction D1, the first pad 21s (the source pad) of the first power element 21 and the second pad 22d (the drain pad) of the second power element 22 are jointly connected to the first conductive member 101, such that the first power element 21 and the second power element 22 are electrically connected to each other in a series manner. It should be noted that quantities of the first and second power elements 21, 22 and an electrical connection manner between the first and second power elements 21, 22 can be adjusted according to practical requirements, and the present disclosure is not limited thereto.

Reference is made to FIG. 4 again. In the instant embodiment, the input/output pins 4 are arranged at one side of the electrical interconnection assembly 1, so that the power module M1 can be electrically connected to another external circuit. Specifically, the input/output pins 4 can be designated to receive or transmit a plurality of different signals. In one embodiment, the input/output pins 4 can be used to transmit a gate driving signal to control operation of each of the power elements 21, 22. Accordingly, each of the input/ output pins 4 can be disposed on the first circuit board 11 or the second circuit board 12, and each of the input/output pins 4 is electrically connected to a corresponding one of the third pads 21g, 22g (the gate pad) of the power elements 21, 22 through the circuit configured in the first circuit board 11 or the second circuit board 12.

Figure 6:
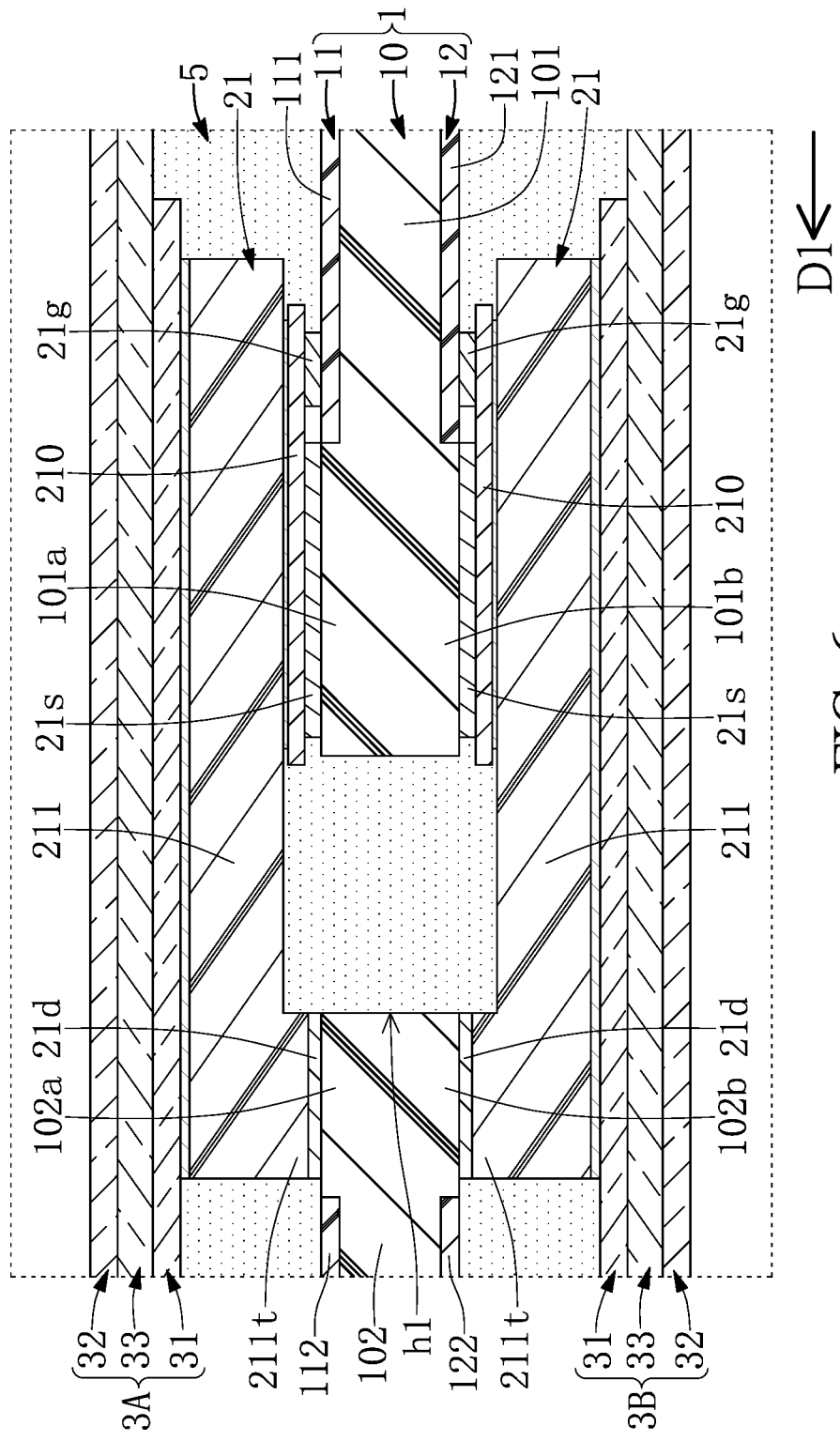
FIG. 6 is a schematic enlarged view of part VI of FIG. 5.

Reference is made to FIG. 5 and FIG. 6, in which FIG. 6 is a schematic enlarged view of part VI of FIG. 5. It is worth mentioning that in the instant embodiment, there is essentially no height difference between a top surface of any one of the first pad arrangement regions 101a of the first conductive member 101 and an upper surface of the first wiring arrangement portion 111 of the first circuit board 11 (or between a bottom surface of any one of the first pad arrangement regions 101b and a lower surface of the first wiring arrangement portion 121 of the second circuit board 12).

As shown in FIG. 6, in one exemplary embodiment, the top surface (or the bottom surface) of any one of the first pad arrangement regions 101a (101b) and the upper surface (or the lower surface) of the first wiring arrangement portion 111 (121) have the same height level and are coplanar. Similarly, there is essentially no height difference between a top surface of the third pad arrangement regions 103a and an upper surface of the third wiring arrangement portion 113 of the first circuit board 11 (or between a bottom surface of the third pad arrangement regions 103b and a lower surface of the third wiring arrangement portion 123 of the second circuit board 12).

Furthermore, as shown in FIG. 5, in the instant embodiment, the top surfaces of any two of the first pad arrangement regions 101a, the second pad arrangement region 102a, and the third pad arrangement region 103a that are located at the same side of the conductive structure 10 are coplanar, such that the power elements 21, 22 can be easily mounted on the electrical interconnection assembly 1 through a surface mount technology (SMT). Similarly, the bottom surfaces of any two of the first pad arrangement regions 101b, the second pad arrangement region 102b, and the third pad arrangement region 103b that are located at another side of the conductive structure 10 are coplanar.

Figure 7:
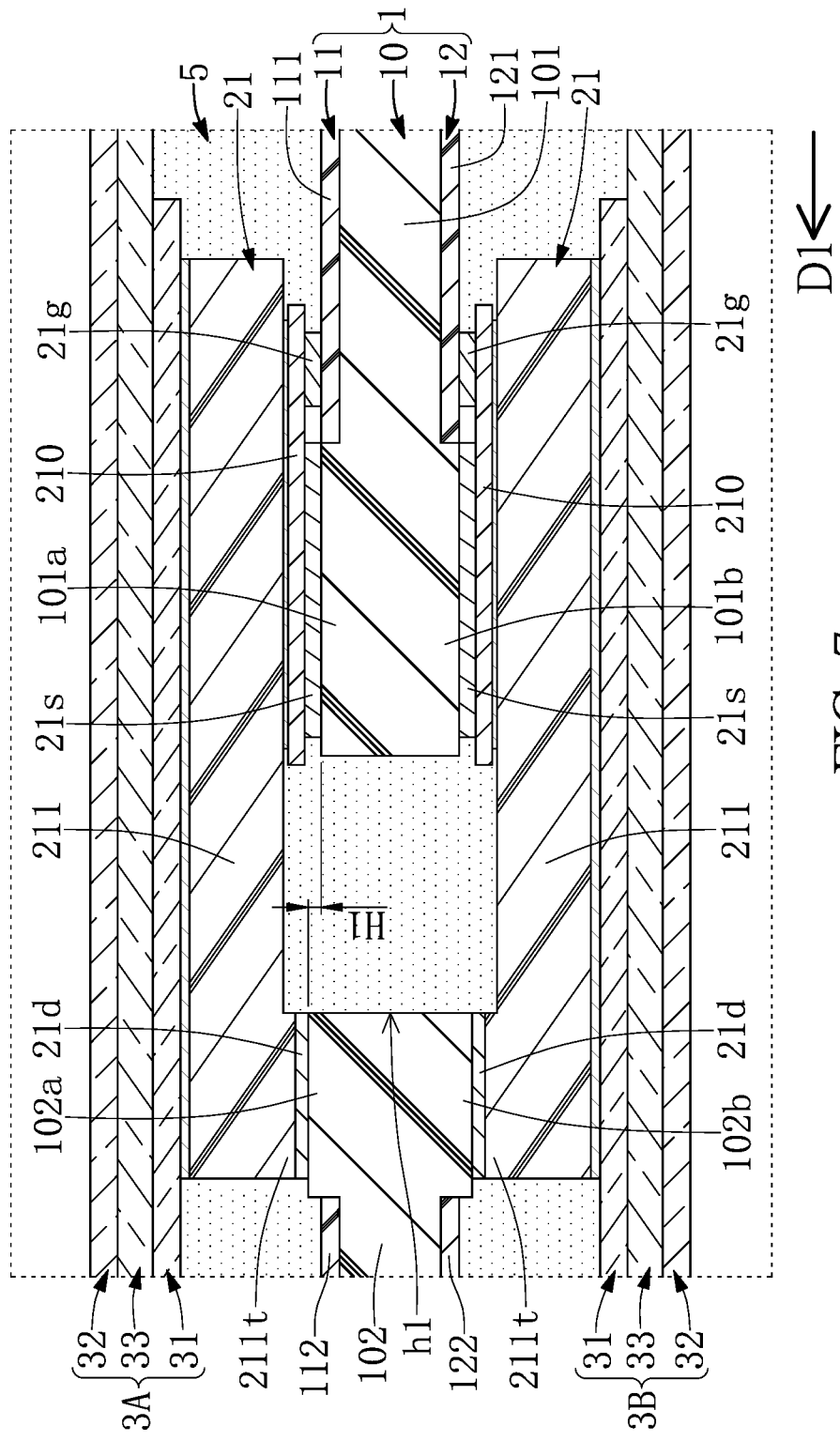
FIG. 7 is a partially enlarged cross-sectional view of a power module according to another embodiment of the present disclosure.

However, the present disclosure is not limited to the example shown in FIG. 6. Reference is made to FIG. 7, which is a partially enlarged cross-sectional view of a power module according to another embodiment of the present disclosure. In the instant embodiment, a height difference H1 is formed between the top surface of the first pad arrangement region 101a and the top surface of the second pad arrangement region 102a. The height difference H1 can be greater than 10 μm, and ranges from 10 μm to 200 μm. Accordingly, a length of the pin portion 211t of the conductive connecting member 211 can be adjusted according to the height difference H1, so that the second pad 21d located at the pin portion 211t can be connected to the second pad arrangement region 102a.

In the embodiment shown in FIG. 7, the top surface of the second pad arrangement region 102a protrudes from the top surface of the first pad arrangement region 101a. Accordingly, the thickness of the second conductive member 102 is greater than that of the first conductive member 101. That is to say, the first to third conductive members 101 to 103 do not necessarily have the same thickness. Furthermore, in the instant embodiment, the bottom surface of the second pad arrangement region 102b also protrudes from the bottom surface of the first pad arrangement region 101b, but the present disclosure is not limited thereto. In another embodiment, the top surface of the second pad arrangement region 102a can be recessed or protrude from the top surface of the first pad arrangement region 101a, but the bottom surface of the second pad arrangement region 102b can still be flush with the bottom surface of the first pad arrangement region 101b, and vice versa.

Reference is made to FIG. 4 again. In the instant embodiment, each of the first and second electronic element groups 2A, 2B can further include a diode element 23 (multiple diode elements are exemplarily illustrated in FIG. 4), and the diode element 23 can be electrically connected to the first power element 21 or the second power element 22 in a parallel manner. The diode element 23 that forms a parallel connection with the first power element 21 is exemplified for description. The diode element 23 and the first power element 21 are arranged in the same row in the second direction D2, and two electrodes 23a, 23b of the diode element 23 pass through the opening 11ha and are connected to the first conductive member 101 and the second conductive member 102, respectively.

However, in other embodiments, the diode element 23 can be omitted. In another embodiment, according to practical requirements, the first and second electronic element groups 2A, 2B can include one of a control element, a passive element, a protective element, and so on. The aforementioned electronic elements and the power elements 21, 22 can be jointly located on the electrical interconnection assembly 1, and can be electrically connected to one another through the electrical interconnection assembly 1, so as to form a part of a standardization circuit.

It is worth mentioning that heat generated by the electronic elements can be dissipated by the conductive structure 10 during operation of the first and second electronic element groups 2A, 2B. That is to say, the conductive structure 10 is used to not only establish electrical connections among the electronic elements, but also assist the electronic elements in heat dissipation.

As shown in FIG. 4 and FIG. 5, the second electronic element group 2B can be disposed on the electrical interconnection assembly 1 by a similar manner. Specifically, the second electronic element group 2B and the second circuit board 12 are both located at the same side of the conductive structure 10, and the second electronic element group 2B includes one or more than one of the power elements 21, 22. For ease of illustration, in the second electronic element group 2B, the power element 21 that is connected between the first and second conductive members 101, 102 is defined as a third power element, and the power element 22 that is connected between the first and third conductive members 101, 103 is defined as a fourth power element.

Accordingly, the first power element 21 of the first electronic element group 2A can be connected to the third power element 21 of the second electronic element group 2B in a parallel manner through the first and second conductive members 101, 102. Moreover, the second power element 22 of the first electronic element group 2A can be connected to the fourth power element 22 of the second electronic element group 2B in a parallel manner through the first and third conductive members 101, 103. As such, even if an area of the electrical interconnection assembly 1 is not increased, a power density of the power module M1 can still be increased. It should be noted that the quantities of the electronic elements of the first and second electronic element groups 2A, 2B are not required to be the same.

Figure 8:
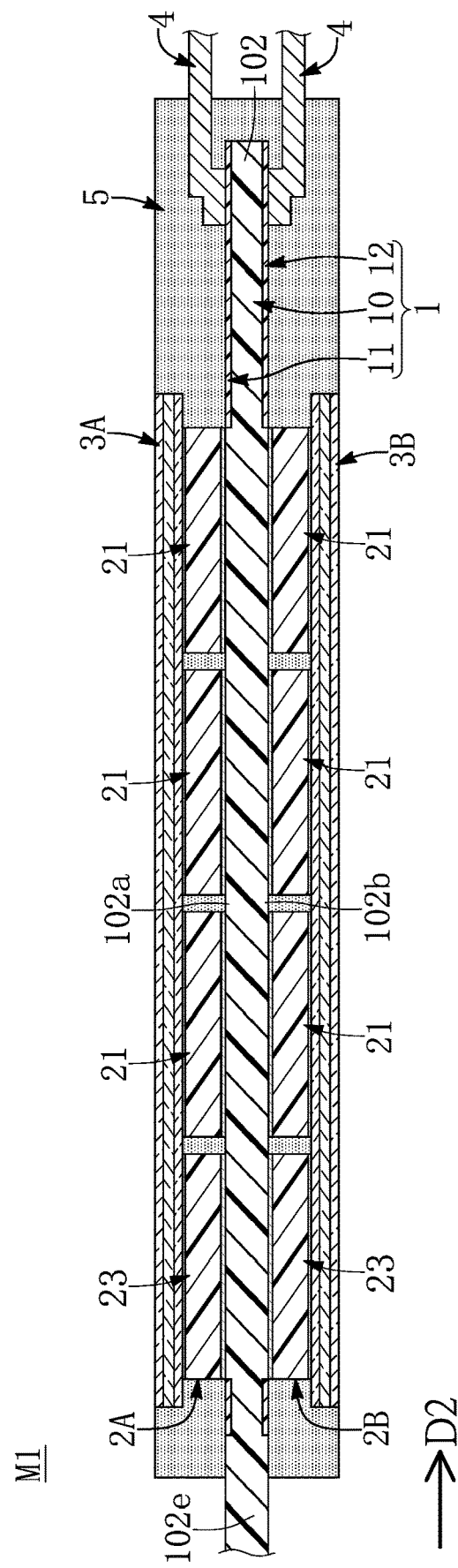
FIG. 8 is a schematic cross-sectional view taken along line VIII-VIII of FIG. 1.

Reference is made to FIG. 8, which is a schematic cross-sectional view taken along line VIII-VIII of FIG. 1. In the first and second electronic element groups 2A, 2B of the instant embodiment, any two closest electronic elements (e.g., the first and third power elements 21) that are respectively located at two opposite sides of the conductive structure 10 are aligned with each other, but the present disclosure is not limited thereto.

Reference is made to FIG. 2, FIG. 3 and FIG. 5. The power module M1 of the first embodiment includes two heat dissipation elements 3A, 3B, and the heat dissipation elements 3A, 3B are located at two opposite sides of the conductive structure 10, respectively. Each of the heat dissipation elements 3A, 3B is disposed on the power elements 21, 22, so as to dissipate heat generated by the power elements 21, 22 during their operation. That is to say, the power elements 21, 22 are disposed between one of the heat dissipation elements 3A, 3B and the electrical interconnection assembly 1. In one embodiment, each of the heat dissipation elements 3A, 3B can be, for example, a direct bonded copper (DBC) or a direct plated copper (DPC), but the present disclosure is not limited thereto.

As shown in FIG. 5, the heat dissipation elements 3A, 3B can include a first conductive patterned layer 31, a second conductive patterned layer 32 and a thermally-conductive insulating body 33 that is located between the first conductive patterned layer 31 and the second conductive patterned layer 32. The first conductive patterned layer 31 includes two conductive parts (not labeled) that are separate from each other, in which one of the conductive parts is directly disposed on the first power elements 21, and another one of the conductive parts is directly disposed on the second power elements 22. The thermally-conductive insulating body 33 can be, for example, a ceramic plate or an insulating adhesive with a higher thermal conductivity, but the present disclosure is not limited thereto. The second conductive patterned layer 32 is disposed on the thermally-conductive insulating body 33 and has a larger area than that of the first conductive patterned layer 31.

Furthermore, the packaging layer 5 covers the electrical interconnection assembly 1 and at least one of the electronic element groups 2A, 2B. However, the electrical interconnection assembly 1, the heat dissipation elements 3A, 3B, and the input/output pins 4 are each partially exposed out of the packaging layer 5. As shown in FIG. 5, the second conductive patterned layer 32 of each of the heat dissipation elements 3A, 3B is exposed out of the packaging layer 5, so that heat generated by the power module M1 during its operation can be effectively dissipated to the outside environment.

In addition, when the power module M1 is implemented in another system circuit (not shown), by respectively connecting the input/output pins 4 and the first to third ending portions 101e to 103e to specific voltage terminals, the power elements 21, 22 and other electronic elements in the power module M1 can be electrically connected to the system circuit.

Second Embodiment

Figure 9:
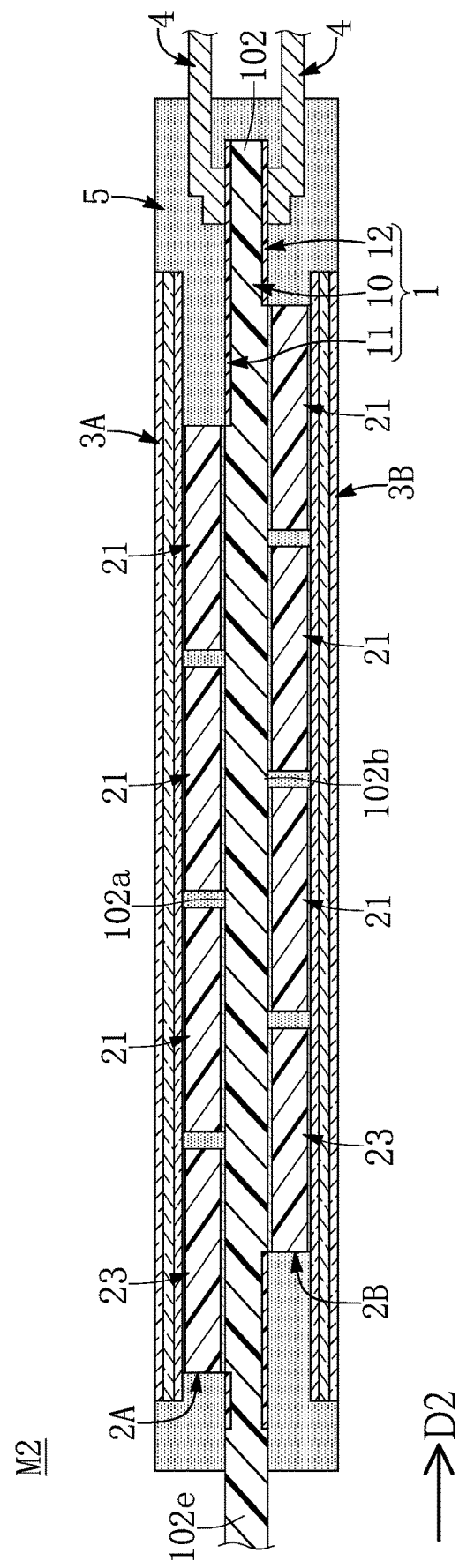
FIG. 9 is a schematic cross-sectional view of a power module according to a second embodiment of the present disclosure.

Reference is made to FIG. 9, which is a schematic cross-sectional view of a power module according to a second embodiment of the present disclosure. Elements in the instant embodiment that are the same or similar to those in the embodiment shown in FIG. 8 are denoted by the same or similar reference numerals, and will not be reiterated herein. In a power module M2 of the instant embodiment, the electronic elements in the first electronic element group 2A and the electronic elements in the second electronic element group 2B that are located at two opposite sides of the conductive structure 10 are not aligned with each other in a thickness direction of the conductive structure 10, but are arranged in a staggered configuration. That is to say, an orthographic projection of any one of the electronic elements in the first electronic element group 2A only partially overlaps with at least one of the electronic elements in the second electronic element group 2B. As such, the heat generated by the electronic elements during their operation can be prevented from being accumulated in a specific region, such that the heat can be easily and rapidly dissipated.

Third Embodiment

Figure 10:
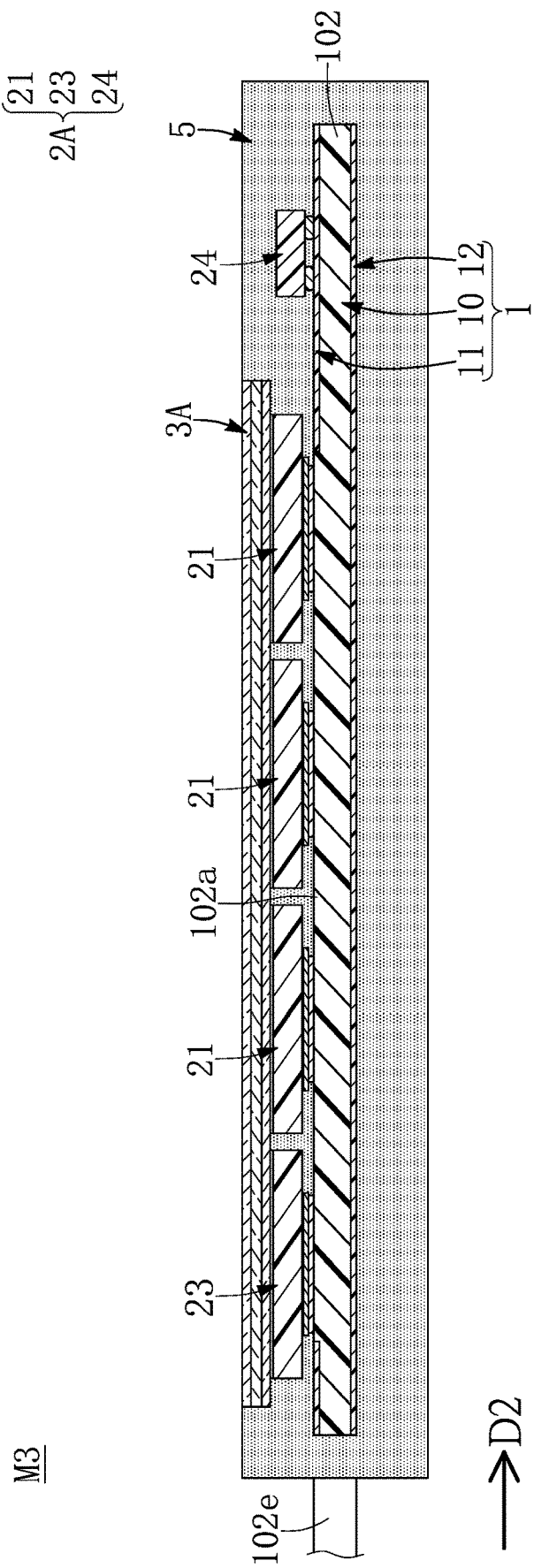
FIG. 10 is a schematic cross-sectional view of a power module according to a third embodiment of the present disclosure.

Reference is made to FIG. 10, which is a schematic cross-sectional view of a power module according to a third embodiment of the present disclosure. Elements in the instant embodiment that are the same or similar to those in the embodiment shown in FIG. 9 are denoted by the same or similar reference numerals, and will not be reiterated herein. A power module M3 of the instant embodiment includes only one electronic element group 2A. In the instant embodiment, the conductive structure 10 has a surface on which the second circuit board 12 is disposed, and the surface is a flat surface and does not have any recessed region.

Furthermore, in the instant embodiment, the electronic element group 2A further includes a control element 24. The control element 24 can be disposed on the first circuit board 11 and electrically connected to the third pads 21g, 22g (the gate pads) of the power elements 21, 22, so as to control each of the power elements 21, 22. In the instant embodiment, the input/output pins 4 can be omitted.

Fourth Embodiment

Figure 11:
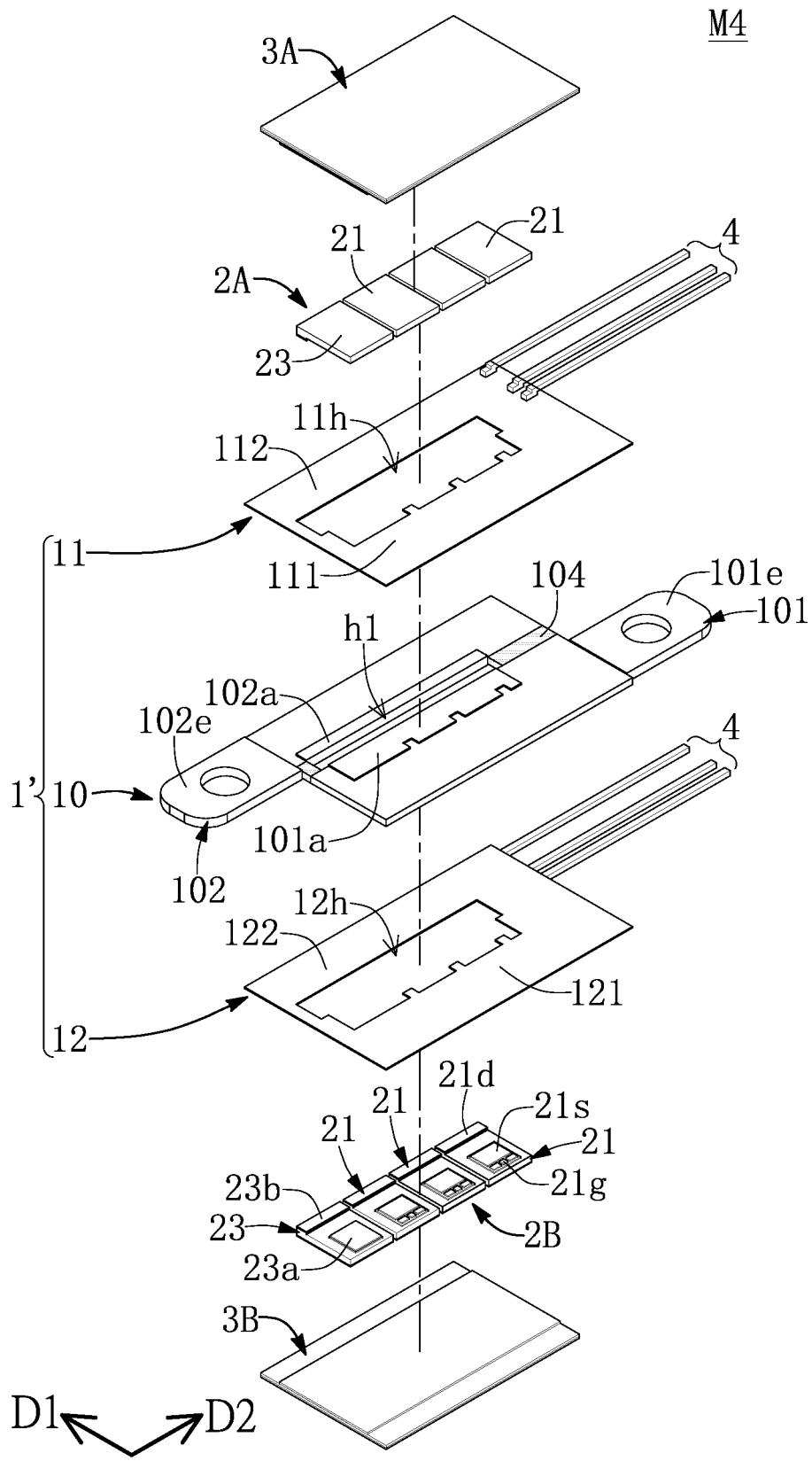
FIG. 11 is a schematic exploded view of a power module without illustrating the packaging layer according to a fourth embodiment of the present disclosure.

Reference is made to FIG. 11, which is a schematic exploded view of the power module without illustrating the packaging layer element according to a fourth embodiment of the present disclosure. Elements of a power module M4 in the instant embodiment that are the same or similar to those of the power module M1 in the first embodiment are denoted by the same or similar reference numerals, and will not be reiterated herein. In an electrical interconnection assembly 1' of the instant embodiment, the conductive structure 10 includes only the first conductive member 101 and the second conductive member 102, and the first and second conductive members 101, 102 are arranged side by side and insulated from each other. The first and second conductive members 101, 102 are spaced apart from each other to define the trench h1.

The first circuit board 11 is arranged at one side of the conductive structure 10 with an opening 11h corresponding in position to the trench h1, and the second circuit board 12 is arranged at another side of the conductive structure 10 with an opening 12h corresponding in position to the trench h1. When the electronic element groups 2A, 2B are respectively disposed at two opposite sides of the electrical interconnection assembly 1', the power elements 21 in the electronic element group 2A and the power elements 21 in the electronic element group 2B can be electrically connected to each other in a parallel manner through the first and second conductive members 101, 102.

Fifth Embodiment

Figure 12:
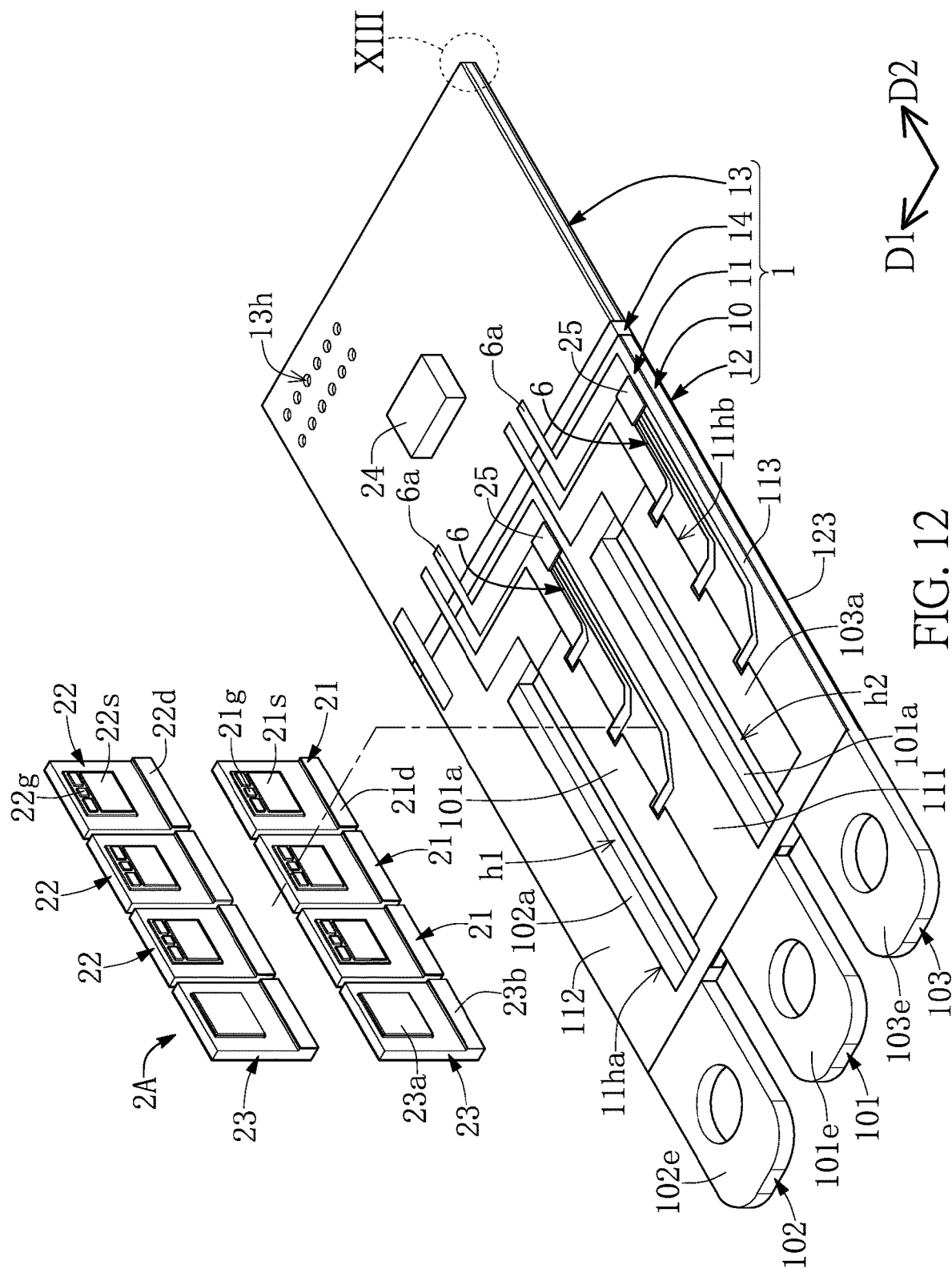
FIG. 12 is a schematic exploded view of a power module without illustrating the packaging layer and the heat dissipation element according to a fifth embodiment of the present disclosure.
Figure 13:
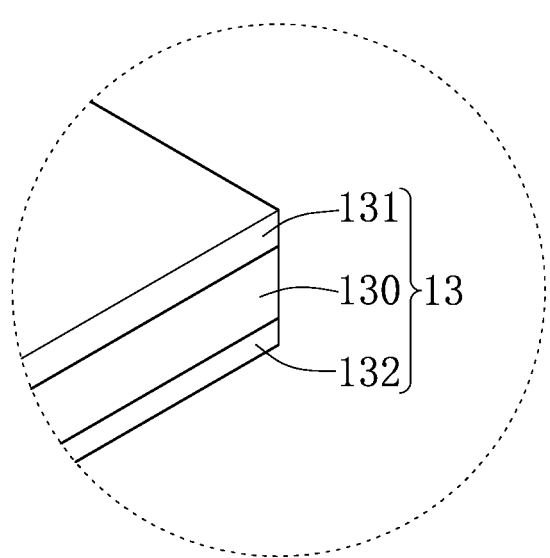
FIG. 13 is a schematic enlarged view of part XIII of FIG. 12.

Reference is made to FIG. 12 and FIG. 13. FIG. 12 is a schematic exploded view of the power module without illustrating the packaging layer and the heat dissipation element according to a fifth embodiment of the present disclosure, and FIG. 13 is a schematic enlarged view of part XIII of FIG. 12. Elements in the instant embodiment that are the same or similar to those of the power module M3 in the third embodiment are denoted by the same or similar reference numerals, and will not be reiterated herein.

In the instant embodiment, the first ending portion 101e of the first conductive member 101, the second ending portion 102e of the second conductive member 102, and the third ending portion 103e of the third conductive member 103 are arranged at the same side. Furthermore, the electrical interconnection assembly 1 of the instant embodiment further includes a multilayer circuit board 13 and an insulating connection portion 14. The multilayer circuit board 13 and the conductive structure 10 are arranged side by side, and are separated from each other by the insulating connection portion 14.

Referring to FIG. 13, the multilayer circuit board 13 of the instant embodiment includes two circuit boards 131, 132 and a conductive plate 130, and the conductive plate 130 is disposed between the circuit boards 131, 132. It should be noted that in the instant embodiment, the conductive plate 130 of the multilayer circuit board 13 and the conductive structure 10 can be simultaneously fabricated by the same process. A material of the conductive plate 130 has a high conductivity, such as copper or any one of copper base alloys, to reduce a parasitic resistance. The circuit board 131 and the first circuit board 11 can be simultaneously fabricated by the same process, and the circuit board 132 and the second circuit board 12 can be simultaneously fabricated by the same process. In one embodiment, the circuit board 131 is a part of the first circuit board 11, and the circuit board 132 is a part of the second circuit board 12. It should be noted that at least one of the circuit boards 131, 132 is a single-layer circuit board or a multilayer circuit board, and another one of the circuit boards 131, 132 can be an insulating board without any circuit layout, a single-layer circuit board or a multilayer circuit board. In the instant embodiment, the circuit board 131 is a single-layer circuit board or a multilayer circuit board, and includes a plurality of wires (not illustrated) and a plurality of pads (not illustrated) that have been arranged in a surface or an interior thereof.

Reference is made to FIG. 12. The multilayer circuit board 13 includes a plurality of conductive vias 13h, and each of the conductive vias 13h extends from the circuit board 131 to the circuit board 132 through the conductive plate 130. As such, by inserting a plurality of pins into the conductive vias 13h, a circuit of the circuit board 131 (or the circuit board 132) can be electrically connected to an external circuit, or the circuits of the circuit boards 131, 132 can be connected to each other.

Furthermore, in the instant embodiment, the electronic element group 2A further includes the control element 24 and at least one passive element 25 (two of which are exemplarily illustrated in FIG. 12). The control element 24 is disposed on the multilayer circuit board 13, and the passive element 25 is disposed on the first circuit board 11. Specifically, the control element 24 of the instant embodiment is disposed on the circuit board 131, but the present disclosure is not limited thereto. In another embodiment, the control element 24 can be disposed on the circuit board 132. The passive element 25 can be, for example, a resistor, but the present disclosure is not limited thereto.

It should be noted that a plurality of traces 6 is disposed on the first circuit board 11, and each of the traces 6 is electrically connected to the first power element 21 or the second power element 22. Additionally, a portion of the traces 6 is connected to the passive element 25, and another portion of the traces 6 is used to connect the circuit of the first circuit board 11 to the circuit of the circuit board 131. The traces 6 can extend from the first circuit board 11 to a surface of the multilayer circuit board 13.

Specifically, in the instant embodiment, the traces 6 each have an extending section 6a to replace the input/output pins 4 in the third embodiment. Furthermore, the extending section 6a of each of the traces 6 extends from the first circuit board 11 to the surface of the multilayer circuit board 13. To be more specific, the extending section 6a of each of the traces 6 extends across the insulating connection portion 14 to be connected to the outermost circuit board 131, so as to be electrically connected to the control element 24.

Sixth Embodiment

Figure 14:
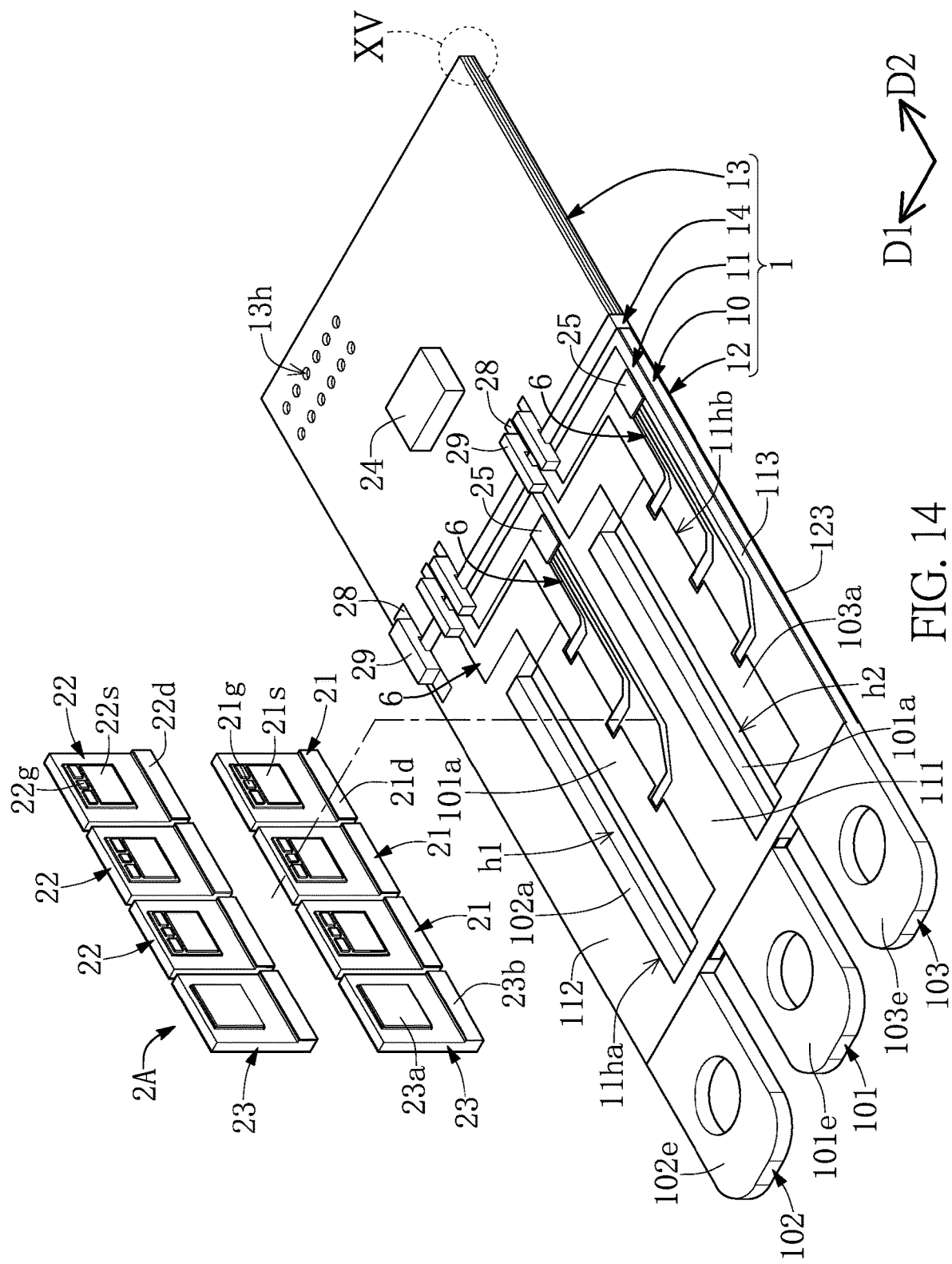
FIG. 14 is a schematic exploded view of a power module without illustrating the packaging layer and the heat dissipation element according to a sixth embodiment of the present disclosure.
Figure 15:
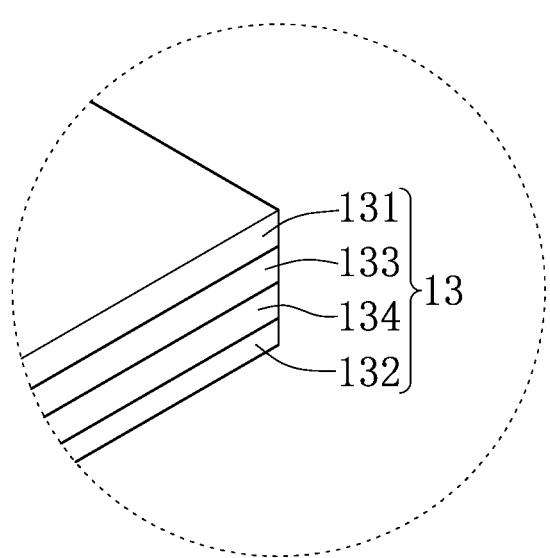
FIG. 15 is a schematic enlarged view of part XV of FIG. 14.

Reference is made to FIG. 14 and FIG. 15. FIG. 14 is a schematic exploded view of the power module without illustrating the packaging layer and the heat dissipation element according to a sixth embodiment of the present disclosure, and FIG. 15 is a schematic enlarged view of part XV of FIG. 14. Elements in the instant embodiment that are the same or similar to those in the previous embodiment shown in FIG. 12 are denoted by the same or similar reference numerals, and will not be reiterated herein. A difference between the instant embodiment and the previous embodiment is that the multilayer circuit board 13 includes four circuit boards 131 to 134.

The multilayer circuit board 13 in the instant embodiment includes at least one contact pad 28 (multiple ones of the contact pad 28 are exemplarily illustrated in FIG. 14) on the surface thereof. The contact pads 28 can be electrically connected to the circuit configured in the circuit board 131. The contact pad 28 can be connected to a corresponding one of the traces 6 through a connecting element 29.

However, as long as each of the traces 6 can be connected to the multilayer circuit board 13, a manner by which the traces 6 are connected to the multilayer circuit board 13 is not limited in the present disclosure. In another embodiment, the contact pad 28 can also be replaced with a conductive contact hole. One end of the connecting element 29 is connected to a corresponding one of the traces 6, and another end of the connecting element 29 can be inserted into its corresponding conductive contact hole, so that the traces 6 can be connected to the multilayer circuit board 13.

Beneficial Effects of the Embodiments

In conclusion, one of the advantages of the power modules provided by the present disclosure is that, by virtue of "the first conductive member 101 and the second conductive member 102 are arranged side by side and insulated from each other," "the circuit boards 11, 12 are disposed on the conductive structure 10," and "the first pad 21s, 22s and the second pad 21d, 22d of the power element 21, 22 are respectively and electrically connected to the first and second conductive members 101, 102, and the third pad 21g, 22g is disposed on the circuit boards 11, 12," each of the power modules M1 to M4 can operate under a high voltage or a high current condition.

To be more specific, in the electrical interconnection assembly 1 provided in the embodiment of the present disclosure, current transmission paths of the electronic elements in the electronic element groups 2A, 2B are formed by using a combination of the circuit boards 11, 12 and the conductive structure 10. The conductive structure 10 is used to increase current paths, such that a large current is allowed to flow therethrough and the conductive structure 10 can have a better heat dissipation capability. Furthermore, according to practical requirements, any one of the control element, the passive element, or the protective element can be disposed on the circuit boards 11, 12. As such, an element expandability of each of the power modules M1 to M4 can be improved, and the power modules M1 to M4 are adapted to form many types of standardization circuits.

In one embodiment, by respectively arranging the first and second circuit boards 11, 12 at the two opposite sides of the conductive structure 10, even if the area of the electrical interconnection assembly 1 is not increased, the quantity of the electronic elements can be increased, thereby increasing a power density of the power module M1, M2 or M4.

Furthermore, a portion of the packaging layer 5 fills into the trench h1 between the first conductive member 101 and the second conductive member 102 and the trench h2 between the second conductive member 102 and the third conductive member 103. When any one of the power modules M1 to M4 operates under a high voltage condition, any one of the power modules M1 to M4 can be prevented from being damaged by an arc discharge current. That is, the voltage withstanding capability of the power modules M1 to M4 can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module, comprising:
    an electrical interconnection assembly including:
        a conductive structure including a first conductive member, a second conductive member, and a third conductive member,
            wherein the first conductive member, the second conductive member, and the third conductive member are arranged side by side and insulated from one another, and the first conductive member and the second conductive member are spaced apart from each other to define a trench therebetween, and the first conductive member and the third conductive member are spaced apart from each other to define another trench therebetween, and
        a first circuit board partially covering the conductive structure, the first circuit board has at least one opening,
            wherein the at least one opening corresponding to the two trenches, the at least one opening also partially corresponding to the first conductive member and partially corresponding to the second conductive member, the first conductive member and the second conductive member are respectively partially exposed in the at least one opening; and
    a first electronic element group including:
        a first power element joining the first conductive member and the second conductive member, wherein the first power element is electrically connected to the first circuit board, and
        a second power element joining the first conductive member and the third conductive member, wherein the second power element is electrically connected to the first circuit board, and the second power element is electrically connected to the first power element in a series manner through the first conductive member,
    wherein a thickness of the first circuit board is less than the thickness of the conductive structure.

2. The power module according to claim 1, wherein the first conductive member, the second conductive member, and the third conductive member jointly define an element arrangement surface, and the first circuit board partially covers the element arrangement surface.

3. The power module according to claim 1, wherein the electrical interconnection assembly further includes a multilayer circuit board and a plurality of traces, the multilayer circuit board and the conductive structure are arranged side by side, and the traces are disposed on the first circuit board and extend to a surface of the multilayer circuit board.

4. The power module according to claim 3, wherein the multilayer circuit board has a plurality of conductive vias.

5. The power module according to claim 3, wherein the multilayer circuit board includes two circuit boards and a conductive plate located between the two circuit boards, and the first electronic element group further includes a control element disposed on one of the circuit boards and electrically connected to the first power element and the second power element through the traces.

6. The power module according to claim 1, wherein the electrical interconnection assembly further includes a multilayer circuit board and a plurality of traces, the multilayer circuit board and the conductive structure are arranged side by side, and the traces are disposed on the first circuit board; wherein the multilayer circuit board includes at least one contact pad disposed on a surface thereof, and the at least one contact pad is connected to a corresponding one of the traces through a connecting element.

7. The power module according to claim 1, wherein the first circuit board partially covers the first conductive member and partially covers the second conductive member, and the first power element includes a source pad, a drain pad, and a gate pad; wherein the source pad is electrically connected to the first conductive member, the drain pad is electrically connected to the second conductive member, and the gate pad is disposed on the first circuit board.

8. The power module according to claim 1, wherein the first circuit board partially covers the third conductive member, and the second power element includes a source pad, a drain pad, and a gate pad; wherein the source pad is electrically connected to the third conductive member, the drain pad is electrically connected to the first conductive member, and the gate pad is disposed on the first circuit board.

9. The power module according to claim 1, wherein the first electronic element group further includes a diode element disposed on the conductive structure, and the diode element is electrically connected to the first power element or the second power element in a parallel manner.

10. The power module according to claim 1, wherein the electrical interconnection assembly further includes a second circuit board that partially covers the conductive structure, and the first circuit board and the second circuit board are located at an upper side and a lower side of the conductive structure, respectively.

11. The power module according to claim 10, further comprising: a second electronic element group disposed on the electrical interconnection assembly, wherein the second electronic element group and the second circuit board are located at a same side of the conductive structure, and the second electronic element group includes a third power element and a fourth power element;

wherein the first power element is electrically connected to the third power element in a parallel manner through the first conductive member and the second conductive member, and the second power element is electrically connected to the fourth power element in a parallel manner through the first conductive member and the third conductive member.

12. The power module according to claim 11, wherein the first power element and the third power element are arranged to be offset from each other, and the second power element and the fourth power element are arranged to be offset from each other.

13. A power module, comprising:
an electrical interconnection assembly including:
a conductive structure including a first conductive member and a second conductive member arranged side by side and insulated from each other, and the first conductive member and the second conductive member are spaced apart from each other to define a trench therebetween, and
a circuit board disposed on the conductive structure, wherein the circuit board has an opening, the at least one opening corresponding to the trench, the at least one opening also partially corresponding to the first conductive member and partially corresponding to the second conductive member, the first conductive member and the second conductive member are respectively partially exposed in the at least one opening; and
an electronic element group including a power element, wherein the power element includes a first pad, a second pad, and a third pad; wherein the first pad and the second pad pass through the opening and are respectively and electrically connected to the first conductive member and the second conductive member, and the third pad is disposed on the circuit board.

14. The power module according to claim 13, wherein the opening defines a first pad arrangement region on the first conductive member, the circuit board has an upper surface that is flush with a top surface of the first pad arrangement region, and the first pad is connected to the first pad arrangement region.

15. The power module according to claim 13, wherein the opening defines a first pad arrangement region on the first conductive member and defines a second pad arrangement region on the second conductive member, and a height difference is formed between a top surface of the first pad arrangement region and a top surface of the second pad arrangement region.

16. The power module according to claim 13, wherein the electrical interconnection assembly further includes: an insulating material disposed in the trench and connected between the first conductive member and the second conductive member.

17. The power module according to claim 13, wherein the electronic element group further includes a diode element disposed on the conductive structure, two electrodes of the diode element are respectively and electrically connected to the first conductive member and the second conductive member through the opening, and the diode element is electrically connected to the power element in a parallel manner.

18. The power module according to claim 13, further comprising: a heat dissipation element disposed on the power element.

19. The power module according to claim 13, wherein the electronic element group further includes a control element disposed on the circuit board and electrically connected to the power element through the circuit board.

* * * * *